United States Patent [19]

Koga et al.

[11] Patent Number: 5,355,334
[45] Date of Patent: Oct. 11, 1994

[54] NONVOLATILE SEMICONDUCTOR MEMORY DEVICE HAVING PARALLEL WRITE AND READ FUNCTION

[75] Inventors: Hiroki Koga; Keisuke Fuchigami, both of Kanagawa, Japan

[73] Assignee: NEC Corporation, Tokyo, Japan

[21] Appl. No.: 180,713

[22] Filed: Jan. 13, 1994

[30] Foreign Application Priority Data

Jan. 13, 1993 [JP] Japan .................................. 5-003714

[51] Int. Cl.$^5$ .............................................. G11C 7/00
[52] U.S. Cl. ........................... 365/189.01; 365/189.07; 365/218; 365/220; 365/230.06
[58] Field of Search .................. 365/189.01, 189.07, 365/200, 201, 218, 220, 230.06, 230.08

[56] References Cited

U.S. PATENT DOCUMENTS

| | | | |
|---|---|---|---|
| 4,811,294 | 3/1989 | Kobayashi et al. | 365/218 |
| 4,860,260 | 8/1989 | Saito et al. | 365/201 |
| 5,111,433 | 5/1992 | Miramoto | 365/201 |
| 5,267,210 | 11/1993 | McClure et al. | 365/218 |

*Primary Examiner*—Eugene R. LaRoche
*Assistant Examiner*—Tan Nguyen

[57] ABSTRACT

In a nonvolatile semiconductor memory device formed by nonvolatile memory cells connected to word lines and bit lines, one of the word lines is selected and driven by row address decoders, and one of the bit lines is selected and driven by column address decoders. An address degenerating circuit formed by NAND circuits, OR circuits or the like is interposed at a prestage of the row address decoders or the column address decoders, thus enabling a parallel write and read function.

15 Claims, 12 Drawing Sheets

P-CHANNEL ENHANCEMENT TYPE TRANSISTOR

N-CHANNEL ENHANCEMENT TYPE TRANSISTOR

NONVOLATILE SEMICONDUCTOR MEMORY DEVICE HAVING PARALLEL WRITE AND READ FUNCTION

BACKGROUND OF THE INVENTION

1. Field of the Invention

The present invention relates to a nonvolatile semiconductor device having a parallel write and read function.

2. Description of the Related Art

In a nonvolatile semiconductor memory device, an electrical write operation can be carried out after the device is mounted on a printed circuit board. One typical example of such a device is a flash memory which has an advantage in that data storage is possible without a backup battery and which is highly integrated.

In such a flash memory, when an erase operation is performed upon a predetermined sector of memory cells or all of the memory cells simultaneously, the threshold voltages of the erased memory cells are fluctuated. In order to avoid such fluctuation, before a flash erase operation, data such as "1" is sequentially written into each of the memory cells, and thereafter, data is sequentially read from each of the memory cells and is compared with expected data which is, in this case, "1", thus requiring a considerable time for a flash erase operation. This will be explained later in detail.

SUMMARY OF THE INVENTION

It is, therefore, an object of the present invention to reduce the time for writing and reading a nonvolatile semiconductor memory device before a flash erase operation.

According to the present invention, in a nonvolatile semiconductor memory device formed by nonvolatile memory cells connected to word lines and bit lines, one of the word lines is selected and driven by row address decoders, and one of the bit lines is selected and driven by column address decoders. An address degenerating circuit formed by NAND circuits, OR circuits or the like is interposed at a prestage of the row address decoders or the column address decoders, thus enabling a parallel write and read function. As a result, the time taken for writing and reading operations upon the memory cells to be erased can be reduced, and therefore, the time for a flash erase operation can be reduced.

BRIEF DESCRIPTION OF THE DRAWINGS

The present invention will be more clearly understood from the description as set forth below as compared with the prior art, with reference to the accompanying drawings, wherein.

DESCRIPTION OF THE PREFERRED EMBODIMENTS

Before the description of the preferred embodiments, a prior art nonvolatile semiconductor memory device will be explained with reference to FIGS. 1 through 5.

Figure 1:
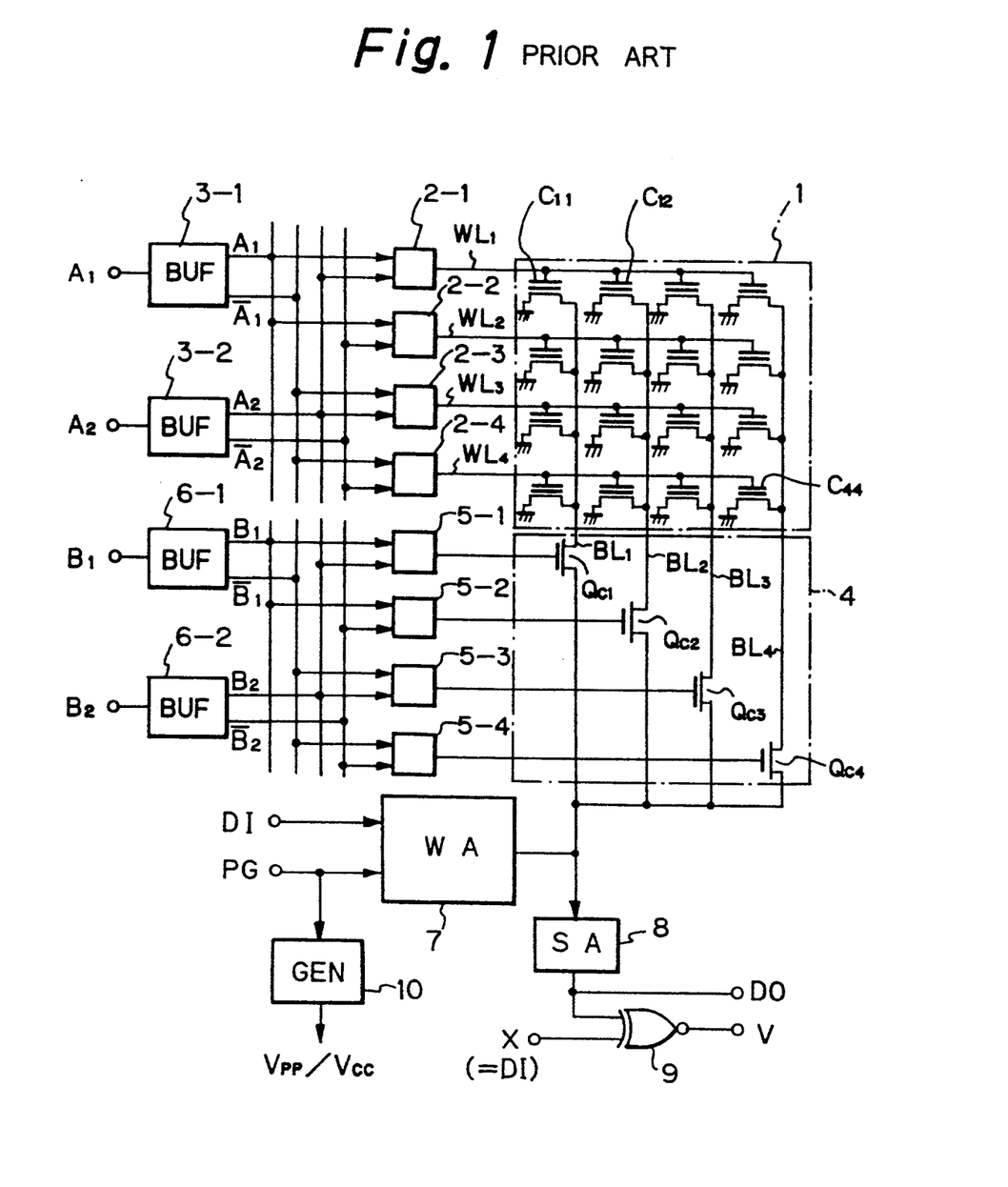
FIG. 1 is a circuit diagram illustrating a prior art nonvolatile semiconductor memory device.

In FIG. 1, four word lines $WL_1$, $WL_2$, $WL_3$ and $WL_4$ and four bit lines $BL_1$, $BL_2$, $BL_3$ and $BL_4$ are provided. Reference numeral 1 designates a NOR type memory cell array formed by nonvolatile memory cells $C_{11}$, $C_{12}$, ..., $C_{44}$ each of which has a source connected to ground, a drain connected to one of the bit lines $BL_1$, $BL_2$, $BL_3$ and $BL_4$, a floating gate, and a control gate connected to one of the word lines $WL_1$, $WL_2$, $WL_3$ and $WL_4$.

Row address decoders 2-1, 2-2, 2-3 and 2-4 receive row address signals $A_1$ and $A_2$ and their inverted signals $\overline{A}_1$ and $\overline{A}_2$ from row address buffers 3-3 1 and 3-2, to thereby select one of the word lines $WL_1$, $WL_2$, $WL_3$ and $WL_4$ and drive it.

The bit lines $BL_1$, $BL_2$, $BL_3$ and $BL_4$ are connected to column switching transistors $Q_{c1}$, $Q_{cc2}$, $Q_{c3}$ and $Q_{c4}$, respectively, of a column switching circuit 4.

Column address decoders 5-1, 5-2, 5-3 and 5-4 receive column address signals $B_1$ and $B_2$ and their inverted signals $\overline{B}_1$ and $\overline{B}_2$ from column address buffers 6-1 and 6-2, to thereby select one of the column switching transistors $Q_{c1}$, $Q_{c2}$, $Q_{c3}$ and $Q_{c4}$ and drive it.

That is, one memory cell is selected by the row address decoders 2-1, 2-2, 2-3 and 2-4 and the column address decoders 5-1, 5-2, 5-3 and 5-4.

The bit lines $BL_1$, $BL_2$, $BL_3$ and $BL_4$ are connected via the column switching transistors $Q_{c1}$, $Q_{c2}$, $Q_{c3}$ and $Q_{c4}$ to a write amplifier 7 and via a sense amplifier 8 to an expectation comparator 9. Note that this sense amplifier 8 is of a current sensing type.

Reference numeral 10 designates a $V_{pp}/V_{cc}$ voltage generating circuit for generating a voltage $V_{pp}/V_{cc}$ which is applied to the row address decoders 2-1, 2-2, 2-3 and 2-4, the column address decoders 5-1, 5-2, 5-3 and 5-4, the write amplifier 7, and the like.

Next, each of the blocks of the device of FIG. 1 will be explained below.

Figure 2:
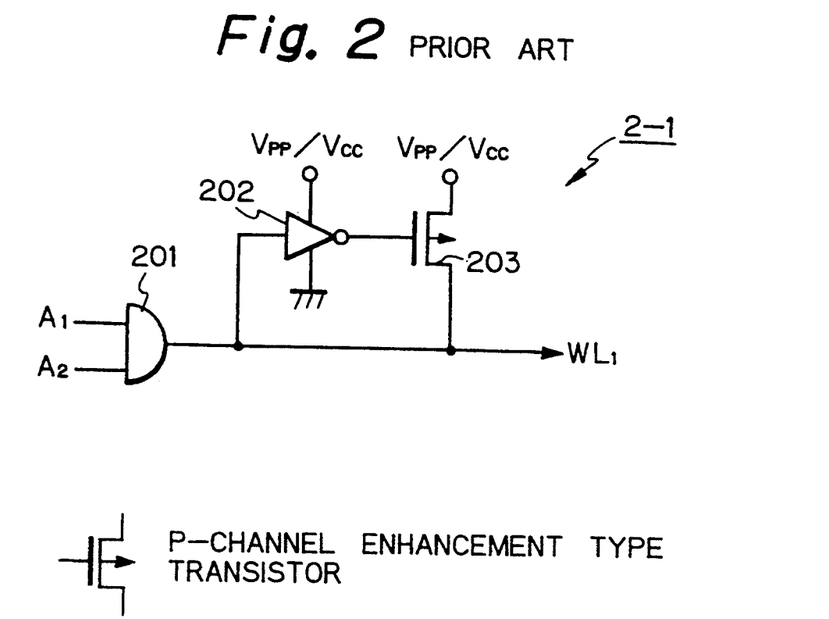
FIG. 2 is a circuit diagram of one address decoder of FIG. 1.

In FIG. 2, which is a detailed circuit diagram of the decoder such as 2-1 of FIG. 1, this decoder 2-1 is of an AND logic type which includes an AND circuit 201 for receiving the address signals $A_1$ and $A_2$, an inverter 202 powered by the voltage $V_{pp}/V_{cc}$, and a P-channel MOS transistor 203. That is, only when both of the inputs $A_1$ and $A_2$ of the AND circuit 201 are high, is the potential at the word line $WL_1$ made high ($=V_{pp}/V_{cc}$), i.e., the word line $WL_1$ is selected and is driven. Note that, in a write or erase mode, the voltage $V_{pp}/V_{cc}$ is a power supply voltage $V_{pp}$ such as 12 V, and in a read mode, the voltage $V_{pp}/V_{cc}$ is a power supply voltage $V_{cc}$ such as 5 V. Otherwise, the output of the AND circuit 201 is low, and as a result, the potential at the word line $WL_1$ is made low (=0 V), i.e., the word line $WL_1$ is not selected and is not driven.

Figure 3:
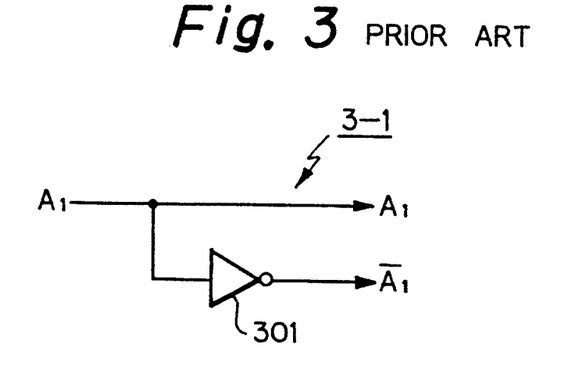
FIG. 3 is a circuit diagram of one address buffer of FIG. 1.

In FIG. 3, which is a detailed circuit diagram of the address buffer such as 3-1 of FIG. 1, the address buffer 3-1 includes an inverter 301, and therefore, generates the address signal $A_1$ and its inverted signal $\overline{A}_1$.

Figure 4:
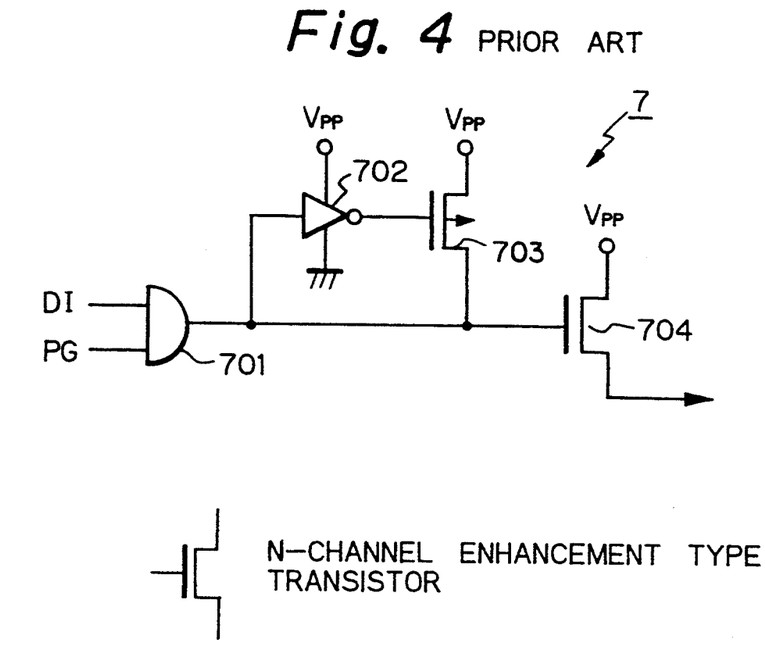
FIG. 4 is a circuit diagram of the write amplifier of FIG. 1.

In FIG. 4, which is a detailed circuit diagram of the write amplifier 7 of FIG. 1, this write amplifier 7 includes an AND circuit 701 for receiving a program signal PG from a control circuit (not shown) and an input data DI, an inverter 702 powered by the voltage $V_{pp}$, a P-channel MOS transistor 703, and an N-channel MOS transistor 704. That is, only when both of the inputs DI and PG of the AND circuit 701 are high, is the source of the MOS transistor 704 made high (=$V_{pp}$), thus carrying out a write operation.

Figure 5:
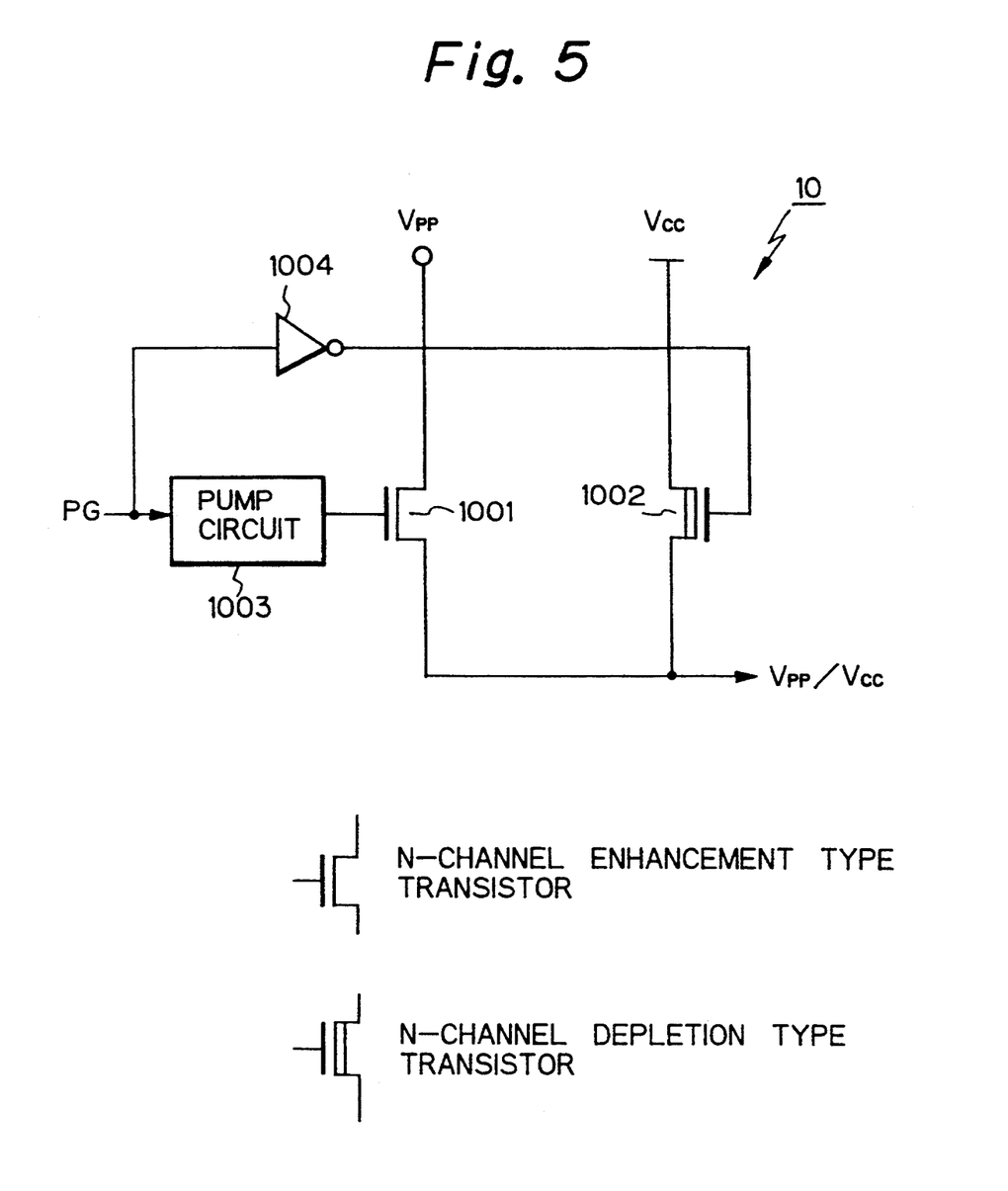
FIG. 5 is a circuit diagram of the $V_{pp}/V_{cc}$ voltage generating circuit of FIG. 1.

In FIG. 5, which is a detailed circuit diagram of the $V_{pp}/V_{cc}$ voltage generating circuit 10 of FIG. 1, this circuit 10 includes an N-channel enhancement type MOS transistor 1001 connected to a high voltage supply $V_{pp}$ such as 12 V, and an N-channel depletion type MOS transistor 1002 connected to a voltage supply $V_{cc}$ such as 5 V. The transistor 1001 is controlled by a pump circuit 1003 which generates a high voltage higher than $V_{pp}$, while the transistor 1002 is controlled by an inverter 1004. The pump circuit 1003 and the inverter 1004 are both controlled by the control signal PG from the control circuit (not shown). If PG=$V_{pp}$, the pump circuit 1003 is enabled to turn ON the transistor 1001, so that the voltage $V_{pp}/V_{cc}$ equals $V_{pp}$. Contrary to this, if PG=GND, the output of the inverter 1002 is made high (=$V_{cc}$) to turn ON the transistor 1002, so that the voltage $V_{pp}/V_{cc}$ equals $V_{cc}$.

In the prior art nonvolatile semiconductor memory device of FIG. 1, in a write and read operation before a flash erase operation, one word line such as $WL_1$ is selected and driven by the row address signals $A_1$ and $A_2$ which are both high (="1"), and one bit line such as $BL_1$ is selected and driven by the row address signals $B_1$ and $B_2$ which are both high (="1"), so that one memory cell such as $C_{11}$ is selected. As a result, in a write mode, input data DI is written into the memory cell $C_{11}$, and in a read mode (expectation comparison mode), data is read from the memory cell $C_{11}$ so that the read data is compared at the expectation comparator 9 by an expected value X which is, in this case, DI. If the read data coincides with the expected value X, the output V of the expectation comparator 9 is "0". Contrary to this, if the read data does not coincide with the expected value X, the output V of the expectation comparator 9 is "1".

In the prior art nonvolatile semiconductor memory device of FIG. 1, however, as explained above, since a write operation and a read operation are performed upon each of the memory cells before a flash erase operation, a considerable time is required.

Figure 6:
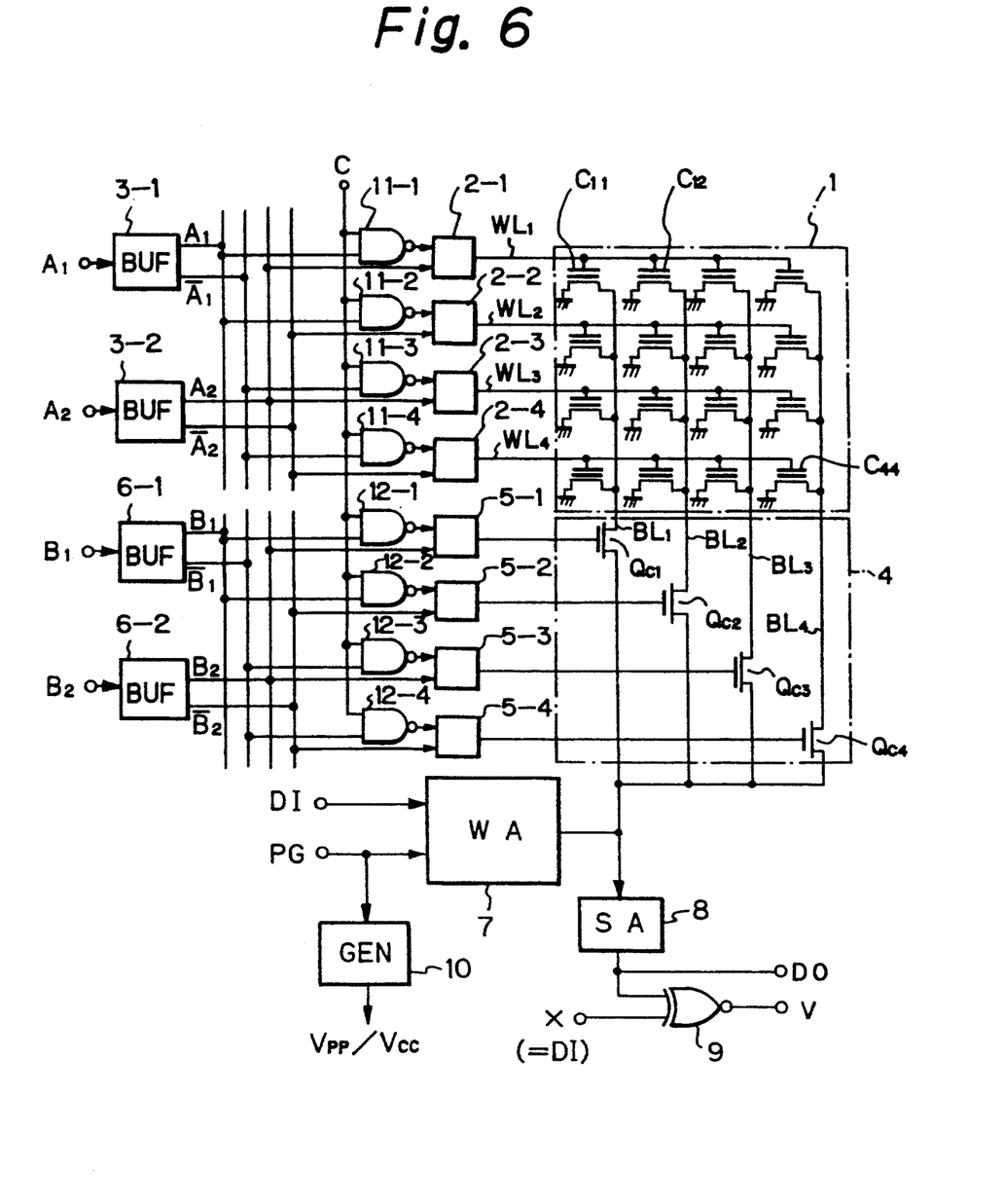
FIG. 6 is a circuit diagram illustrating a first embodiment of the nonvolatile semiconductor memory device according to the present invention.

In FIG. 6, which illustrates a first embodiment of the present invention, NAND circuits 11-1, 11-2, 11-3 and 11-4 as row address degenerating means are inserted between the row address buffer 3-1 and the row address decoders 2-1, 2-2, 2-3 and 2-4. Also, NAND circuits 12-1, 12-2, 12-3 and 12-4 as column address degenerating means are inserted between the column address buffer 6-1 and the column address decoders 5-1, 5-2, 5-3 and 5-4.

In a usual read mode, a control signal C having a high level is supplied from the control circuit (not shown) to inputs of the NAND circuits 11-1, 11-2, 11-3 and 11-4 and inputs of the NAND circuits 12-1, 12-2, 12-3 and 12-4. In this case, the operation of the device of FIG. 6 is the same as that of the device of FIG. 1.

In a write and read mode before a flash erase operation, the control signal C having a low level is supplied from the control circuit (not shown) to the inputs of the NAND circuits 11-1, 11-2, 11-3 and 11-4 and the inputs of the NAND circuits 12-1, 12-2, 12-3 and 12-4. As a result, the outputs of the NAND circuits 11-1, 11-2, 11-3 and 11-4 and the outputs of the NAND circuits 12-1, 12-2, 12-3 and 12-4 are high regardless of the row address signal $A_1$ ($\overline{A}_1$) and the column address signal $B_1$ ($\overline{B}_1$). In other words, the write and read operations are carried out by only the row address signal $A_2$ ($\overline{A}_2$) and the column address signal $B_2$ ($\overline{B}_2$). For example, when $A_2$="1" and $B_2$="1", the two word lines $WL_1$ and $WL_3$ are selected and the two bit lines $BL_1$ and $BL_3$ are selected, so that the four memory cells $C_{11}$, $C_{13}$, $C_{31}$ and $C_{33}$ are selected simultaneously. In this case, in a write mode, input data DI is written simultaneously into the memory cells $C_{11}$, $C_{13}$, $C_{31}$ and $C_{33}$, so that the threshold voltages thereof are made higher. After that, in a read mode, since all the threshold voltages of the memory cells $C_{11}$, $C_{13}$, $C_{31}$ and $C_{33}$ are high so that a current does not flow through any of the memory cells $C_{11}$, $C_{13}$, $C_{31}$ and $C_{33}$, the output DO of the sense amplifier 8 becomes high (="1"), and the output V of the expectation comparator 9 becomes low (="0"). Note that, if an incomplete write operation is performed upon at least one of the memory cells $C_{11}$, $C_{13}$, $C_{31}$ and $C_{33}$, a current flows through such a memory cell whose threshold voltage is not high in a read mode, so that the output DO of the sense amplifier 8 becomes low (="0"), and the output V of the expectation comparator 9 becomes high (="1").

Thus, in FIG. 6, when the control signal is low, a row address formed by two bits $A_1$ and $A_2$ is degenerated into a row address formed by one bit $A_2$. In other words, the row address signal $A_2$ (="1") designates two word lines $WL_1$ and $WL_3$, while the row address signal $A_2$ (="0") designates two word lines $WL_2$ and $WL_4$. Similarly, the column address signal $B_2$ (="1") designates two bit lines $BL_1$ and $BL_3$, while the column address signal $B_2$ (="0") designates two bit lines $BL_2$ and $BL_4$. In this case, the degeneracy of row addresses is 2, the degeneracy of column addresses is 2, and the degeneracy of addresses is 4 (=2×2).

In FIG. 6, the NAND circuits 11-1 and 11-2 receive the same input signals; the NAND circuits 11-3 and 11-4 receive the same input signals; the NAND circuits 12-1 and 12-2 receive the same input signals; and the NAND circuits 12-3 and 12-4 receive the same input signals. Therefore, as illustrated in FIG. 7, the NAND circuits 11-2, 11-4, 12-2 and 12-4 can be deleted.

Figure 7:
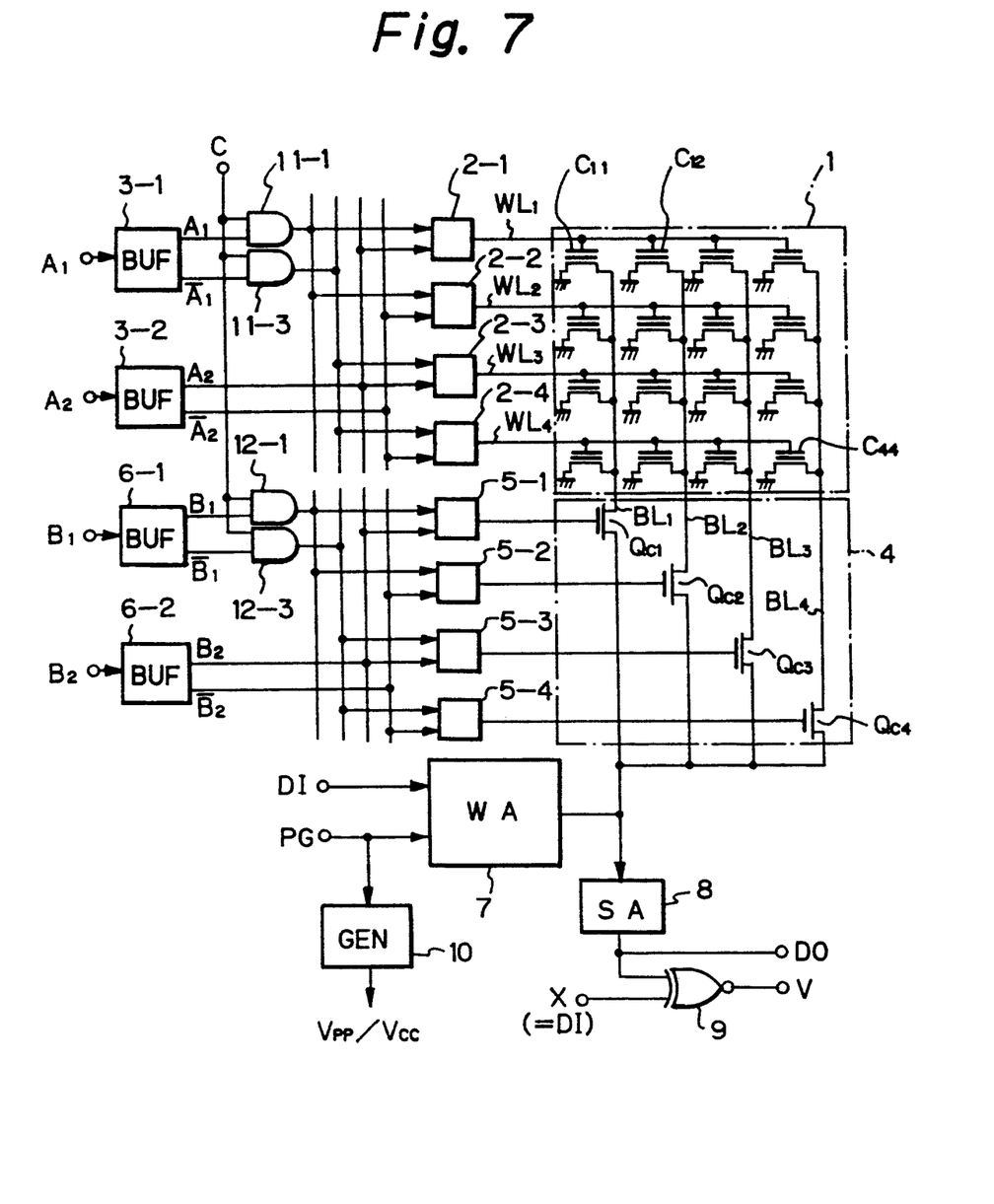
FIG. 7 is a circuit diagram of a modification of the circuit of FIG. 6.
Figure 8:
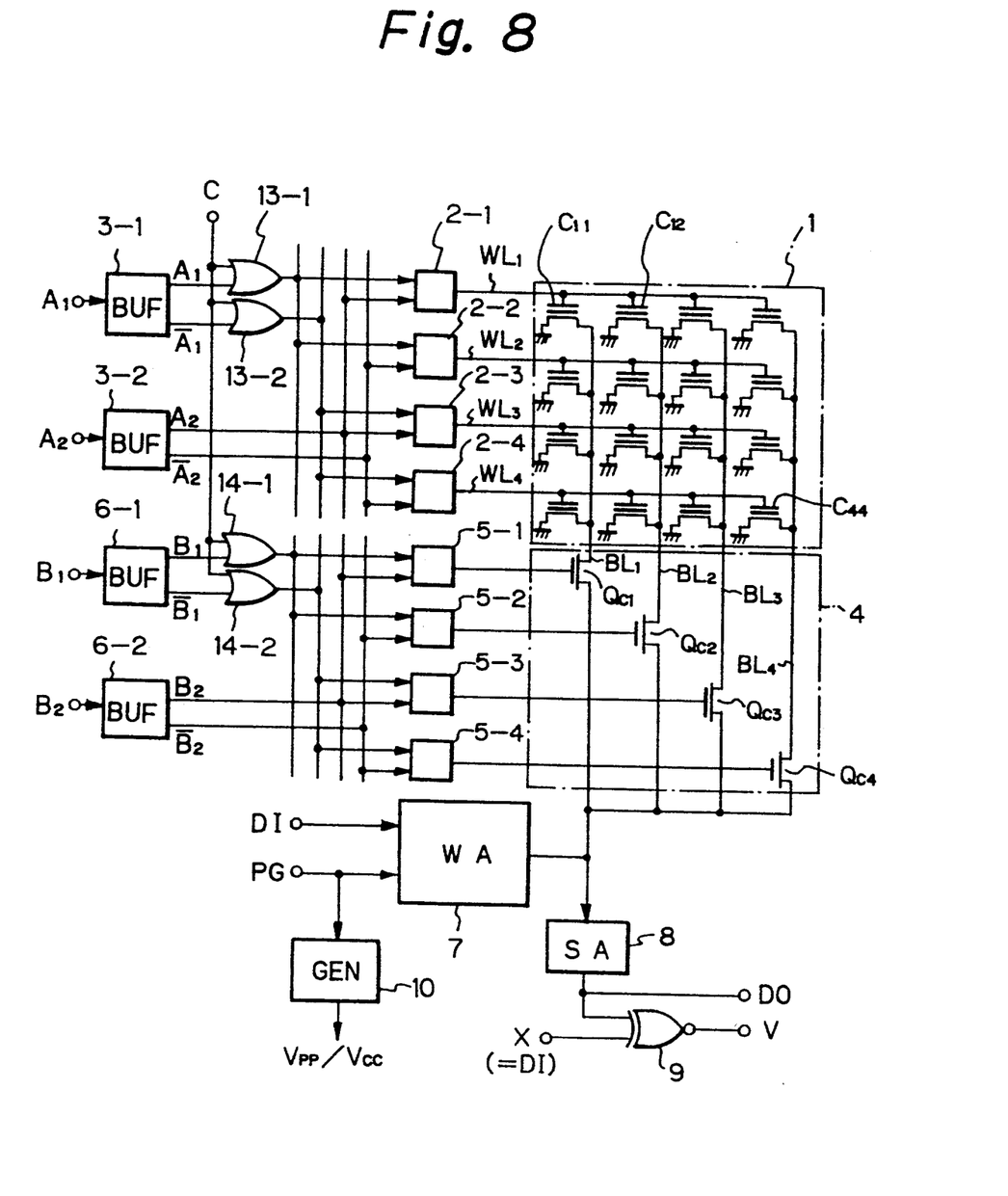
FIG. 8 is a circuit diagram illustrating a second embodiment of the nonvolatile semiconductor memory device according to the present invention.

In FIG. 8, which illustrates a second embodiment of the present invention, OR circuits 13-1, 13-2, 14-1 and 14-2 are provided instead of the NAND circuits 11-1, 11-3, 12-1 and 12-3, respectively, of FIG. 7. In FIG. 8, in a usual read mode, the control signal C is low. On the other hand, in a write and read mode before a flash erase operation, the control signal C is high, so that the outputs of the OR circuits 13-1 and 13-2 and the outputs of the OR circuits 14-1 and 14-2 are high regardless of the row address signal $A_1$ and the column address signal $B_1$. As a result, the operation of the device of FIG. 8 is the same as that of the device of FIG. 6 or 7.

Figure 9:
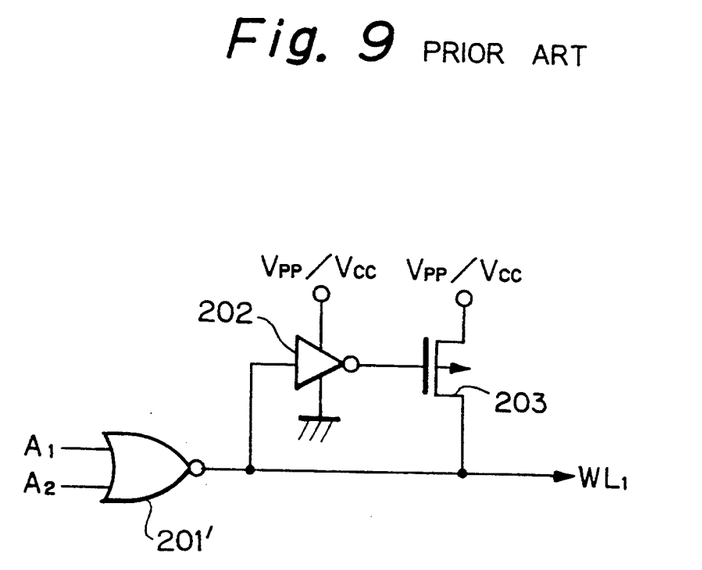
FIG. 9 is a circuit diagram of an OR logic type address decoder.

On the other hand, the address decoder such as 2-1 can be of an OR logic type. That is, as illustrated in FIG. 9, an OR logic type address decoder includes a NOR circuit 201' instead of the AND circuit 201 of FIG. 2. In this case, only when all of the inputs such as $A_1$ and $A_2$ of the NOR circuit 201' are low, is the potential at the word line $WL_1$ made high ($=V_{pp}/V_{cc}$), i.e., the word line $WL_1$ is selected and is driven. Otherwise, the output of the NOR circuit 201' is low, and as a result, the potential at the word line $WL_1$ is made low ($=0$ V), i.e., the word line $WL_1$ is not selected and is not driven.

Figure 10:
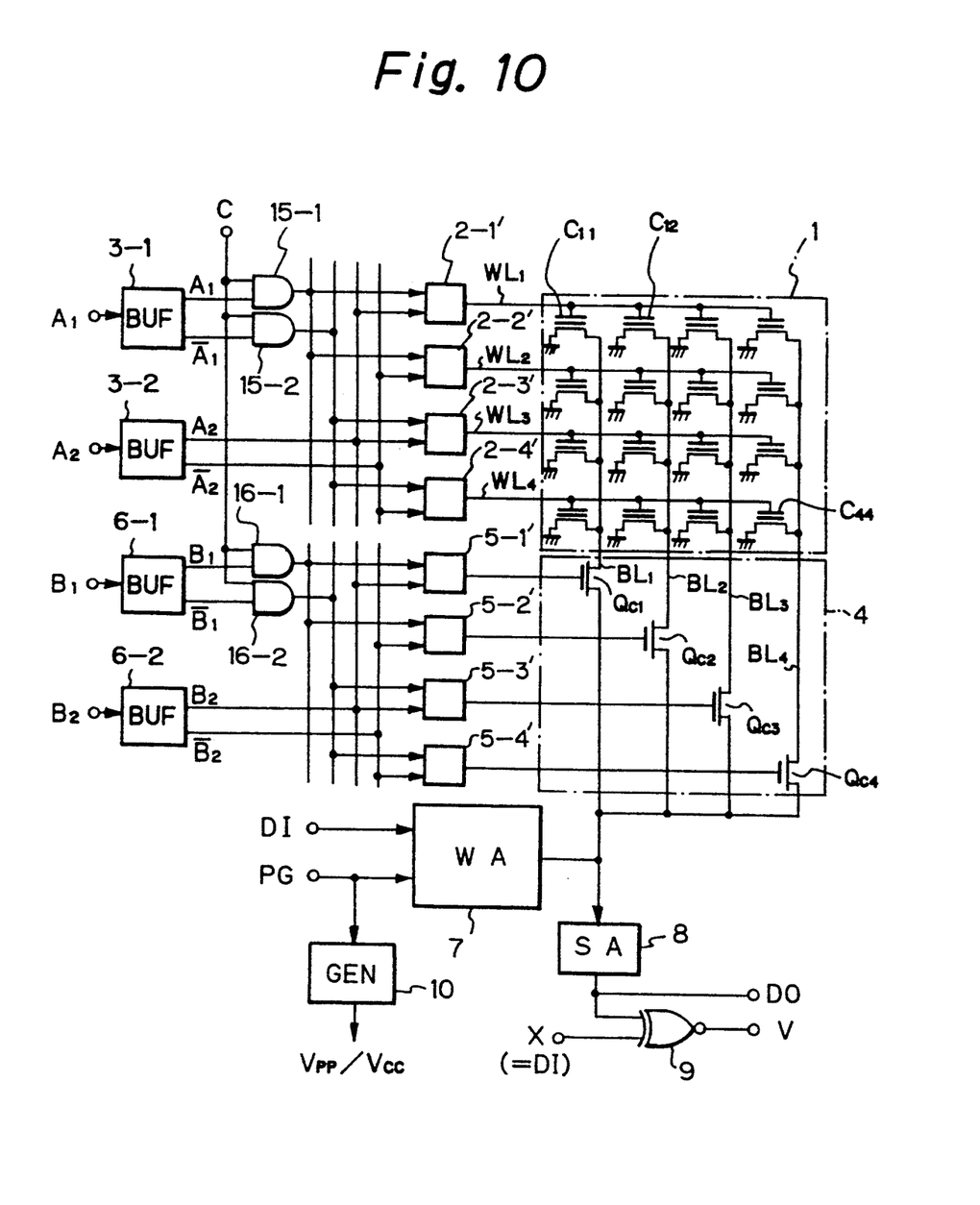
FIG. 10 is a circuit diagram illustrating a third embodiment of the nonvolatile semiconductor memory device according to the present invention.

In FIG. 10, which illustrates a third embodiment of the present invention, OR logic type row address decoders 2-1', 2-2', 2-3' and 2-4' and OR logic type column address decoders 5-1', 5-2', 5-3' and 5-4' are provided instead of the AND logic type row address decoders 2-1, 2-2, 2-3 and 2-4 and the AND logic type column address decoders 5-1, 5-2, 5-3 and 5-4, respectively, of FIG. 7. Also, AND circuits 15-1 and 15-2 and AND circuits 16-1 and 16-2 are provided instead of the NAND circuits 11-1 and 11-3 and the NAND circuits 12-1 and 12-3, respectively, of FIG. 7. In FIG. 10, in a usual read mode, the control signal C is high. On the other hand, in a write and read mode before a flash erase operation, the control signal C is low, so that the outputs of the AND circuits 15-1 and 15-2 and the outputs of the AND circuits 16-1 and 16-2 are low regardless of the row address signal $A_1$ and the column address signal $B_1$. As a result, the operation of the device of FIG. 10 is also the same as that of the device of FIG. 6 or 7.

Figure 11:
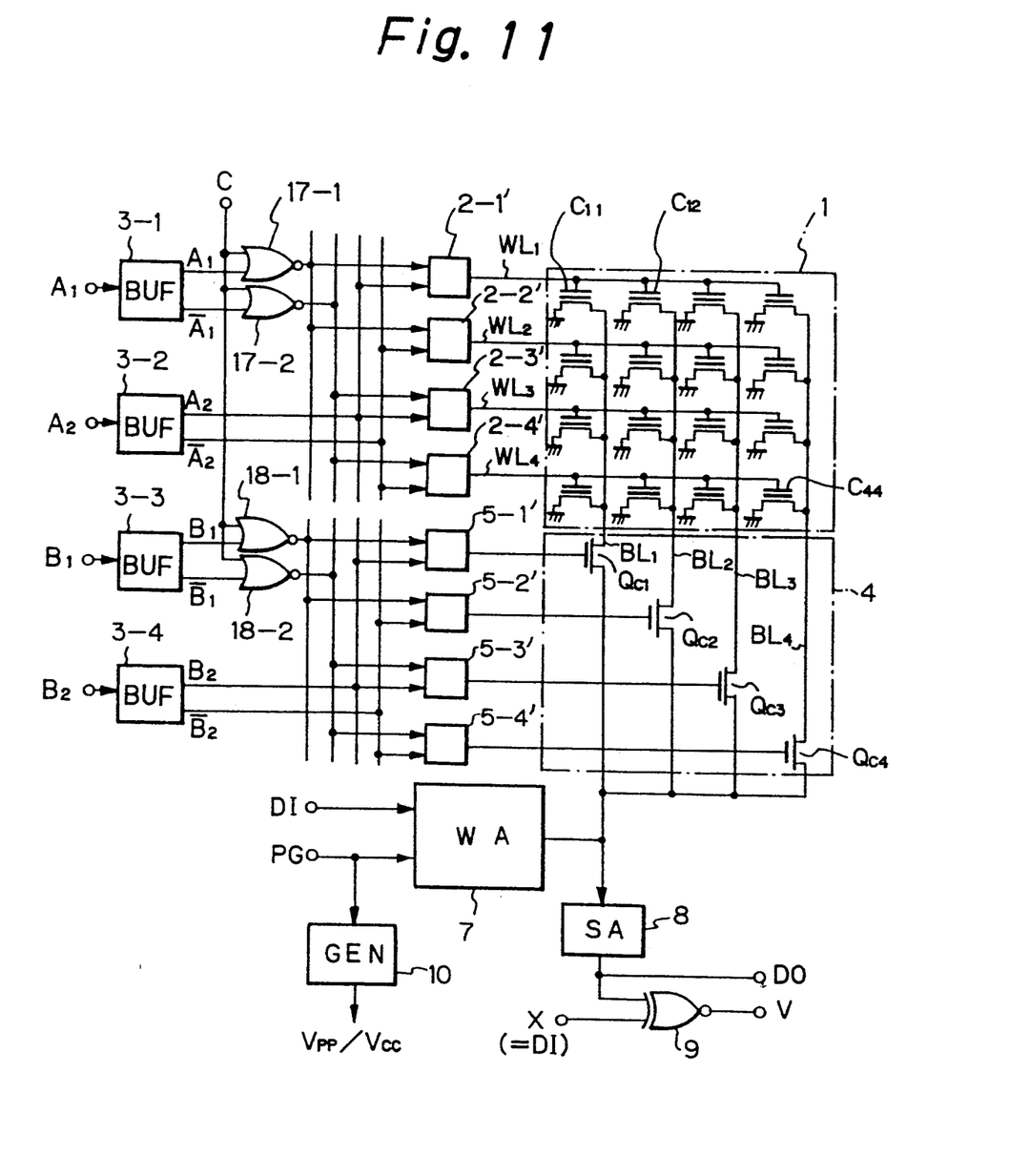
FIG. 11 is a circuit diagram illustrating a fourth embodiment of the nonvolatile semiconductor memory device according to the present invention.

In FIG. 11, which illustrates a fourth embodiment of the present invention, NOR circuits 17-1 and 17-2 and NOR circuits 18-1 and 18-2 are provided instead of the AND circuits 15-1 and 15-2 and the AND circuits 16-1 and 16-2, respectively, of FIG. 10. In FIG. 11, in a usual read mode, the control signal C is low. On the other hand, in a write and read mode before a flash erase operation, the control signal C is high, so that the outputs of the NOR circuits 17-1 and 17-2 and the outputs of the NOR circuits 18-1 and 18-2 are low regardless of the row address signal $A_1$ and the column address signal $B_1$. As a result, the operation of the device of FIG. 11 is also the same as that of the device of FIG. 10.

Figure 12A:
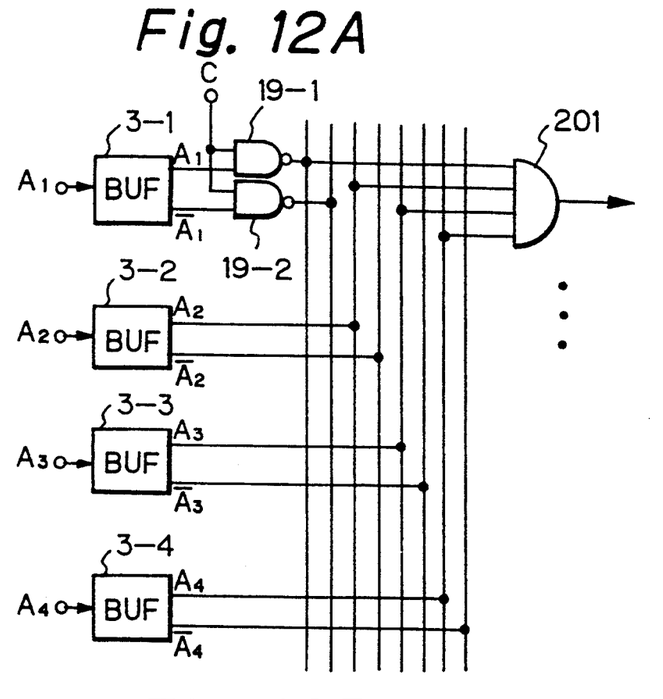
FIGS. 12A, 12B, 12C and 12D are circuit diagrams of modifications of the circuit of FIG. 7.

In FIGS. 6, 7, 8, 10 and 11, a row address is formed by two bits $A_1$ and $A_2$, however, the present invention can be easily applied to a row address formed by three or more bits. For example, as illustrated in FIG. 12A, a row address is formed by four bits $A_1$, $A_2$, $A_3$ and $A_4$. When the control signal C is low, this row address formed by four bits $A_1$, $A_2$, $A_3$ and $A_4$ is degenerated by NAND circuits 19-1 and 19-2 into a row address formed by three bits $A_2$, $A_3$ and $A_4$, so that the degeneracy of row addresses is 2.

Figure 12B:
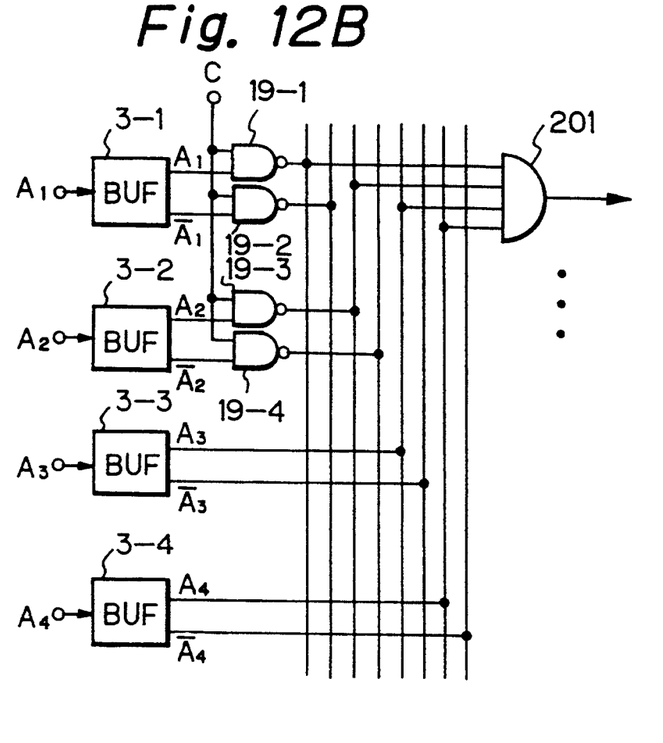
Figure 12C:
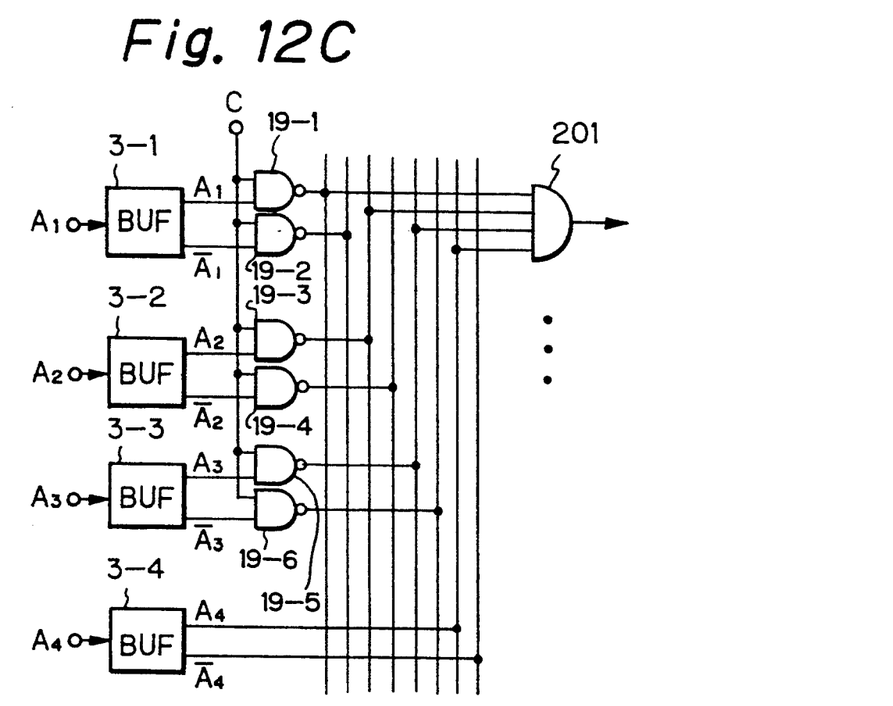
Figure 12D:
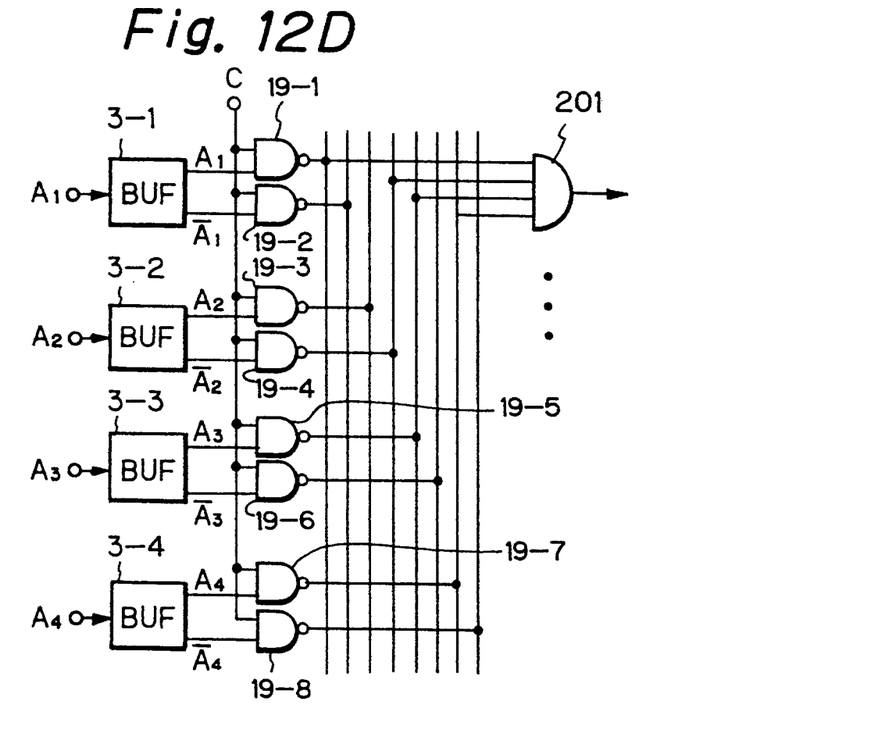

Also, various degeneracies of row addresses can be adopted. For example, as illustrated in FIG. 12B, when the control signal C is low, this row address formed by four bits $A_1$, $A_2$, $A_3$ and $A_4$ is degenerated by NAND circuits 19-1, 19-2, 19-3 and 19-4 into a row address formed by two bits $A_3$ and $A_4$, so that the degeneracy of row addresses is 4 ($=2^2$). As illustrated in FIG. 12C, when the control signal C is low, this row address formed by four bits $A_1$, $A_2$, $A_3$ and $A_4$ is degenerated by NAND circuits 19-1, 19-2, 19-3, 19-4, 19-5 and 19-6 into a row address formed by one bit $A_4$, so that the degeneracy of row addresses is 8 ($=2^3$). Further, as illustrated in FIG. 12D, when the control signal C is low, this row address formed by four bits $A_1$, $A_2$, $A_3$ and $A_4$ is degenerated by NAND circuits 19-1 through 19-8 into one row address so that the degeneracy of row addresses is 16 ($=2^4$). In this case, all the word lines are selected and driven simultaneously.

The above-mentioned modifications for row addresses are also possible for column addresses.

Further, the above-mentioned address degenerating means such as the NAND circuits and the OR circuits can be provided only for the row addresses or only for the column addresses.

As explained hereinbefore, according to the present invention, since a parallel write and read function for a plurality of memory cells to be erased can be carried out, the time taken for writing and reading operations can be reduced, thus reducing the time for a flash erase operation.

We claim:

1. A nonvolatile semiconductor memory device comprising:

$M(=2^m, m=1, 2,...)$ word lines;

$N(=2^n, n=1, 2,...)$ bit lines;

$M \times N$ nonvolatile memory cells, each connected to one of said word lines and one of said bit lines;

m row address buffers each for generating a row address signal and its inverted signal;

M row address decoders, each connected to said row address buffers and to one of said word lines, for receiving one of the row address and the inverted signal of each of said row address buffers to select one of said word lines and drive it;

n column address buffers each for generating a column address signal and its inverted signal;

N column address decoders, each connected to said column address buffers and to one of said bit lines, for receiving one of the column address and its inverted signal of each of said column address buffers to select one of said bit lines and drive it; and degenerating means, interposed between at least one of said row address buffers and said row decoders, for bringing outputs of said at least one of said row address buffers to a selected level when receiving a parallel write and read signal.

2. A device as set forth in claim 1, wherein each of said row address decoders comprises art AND logic type circuit, said degenerating means comprising NAND circuits interposed between said at least one of said row address buffers and said row decoders.

3. A device as set forth in claim 1, wherein each of said row address decoders comprises art AND logic type circuit, said degenerating means comprising OR circuits interposed between said at least one of said row address buffers and said row decoders.

4. A device as set forth in claim 1, wherein each of said row address decoders comprises an OR logic type circuit, said degenerating means comprising AND circuits interposed between said at least one of said row address buffers and said row decoders.

5. A device as set forth in claim 1, wherein each of said row address decoders comprises an OR logic type circuit, said degenerating means comprising NOR circuits interposed between said at least one of said row address buffers and said row decoders.

6. A nonvolatile semiconductor memory device comprising:

$M(=2^m, m=1, 2,...)$ word lines;

$N(=2^n, n=1, 2,...)$ bit lines,

M×N nonvolatile memory cells, each connected to one of said word lines and one of said bit lines;

m row address buffers each for generating a row address signal and its inverted signal;

M row address decoders, each connected to said row address buffers and to one of said word lines, for receiving one of the row address and the inverted signal of each of said row address buffers to select one of said word lines and drive it;

n column address buffers each for generating a column address signal and its inverted signal;

N column address decoders, each connected to said column address buffers and to one of said bit lines, for receiving one of the column address and its inverted signal of each of said column address buffers to select one of said bit lines and drive it; and degenerating means, interposed between at least one of said column address buffers and said column decoders, for bringing outputs of said at least one of said column address buffers to a selected level when receiving a parallel write and read signal.

7. A device as set forth in claim 6, wherein each of said column address decoders comprises an AND logic type circuit, said degenerating means comprising NAND circuits interposed between said at least one of said column address buffers and said column decoders.

8. A device as set forth in claim 6, wherein each of said column address decoders comprises an AND logic type circuit, said degenerating means comprising OR circuits interposed between said at least one of said column address buffers and said column decoders.

9. A device as set forth in claim 6, wherein each of said column address decoders comprises an OR logic type circuit, said degenerating means comprising AND circuits interposed between said at least one of said column address buffers and said column decoders.

10. A device as set forth in claim 6, wherein each of said column address decoders comprises an OR logic type circuit, said degenerating means comprising NOR circuits interposed between said at least one of said column address buffers and said column decoders.

11. A nonvolatile semiconductor memory device comprising:

$M(=2^m, m=1, 2,...)$ word lines;

$N(=2^n, n=1, 2,...)$ bit lines,

M×N nonvolatile memory cells, each connected to one of said word lines and one of said bit lines;

m row address buffers each for generating a row address signal and its inverted signal;

M row address decoders, each connected to said row address buffers and to one of said word lines, for receiving one of the row address and the inverted signal of each of said row address buffers to select one of said word lines and drive it;

n column address buffers each for generating a column address signal and its inverted signal;

N column address decoders, each connected to said column address buffers and to one of said bit lines, for receiving one of the column address and the inverted signal of each of said column address buffers to select one of said bit lines and drive it;

row degenerating means, interposed between at least one of said row address buffers and said row decoders, for bringing outputs of said at least one of said row address buffers to a selected level when receiving a parallel write and read signal; and column degenerating means, interposed between at least one of said column address buffers and said column decoders, for bringing outputs of said at least one of said column address buffers to a selected level when receiving the parallel write and read signal.

12. A device as set forth in claim 11, wherein each of said row address decoders comprises an AND logic type circuit, said row degenerating means comprising NAND circuits interposed between said at least one of said row address buffers and said row decoders, and wherein each of said column address decoders comprises an AND logic type circuit, said column degenerating means comprising NAND circuits interposed between said at least one of said column address buffers and said column decoders.

13. A device as set forth in claim 11, wherein each of said row address decoders comprises art AND logic type circuit, said row degenerating means comprising OR circuits interposed between said at least one of said row address buffers and said row decoders, and wherein each of said column address decoders comprises an AND logic type circuit, said column degenerating means comprising OR circuits interposed between said at least one of said column address buffers and said column decoders.

14. A device as set forth in claim 1, wherein each of said row address decoders comprises an OR logic type circuit, said row degenerating means comprising AND circuits interposed between said at least one of said row address buffers and said row decoders, and wherein each of said column address decoders comprises an OR logic type circuit, said column degenerating means comprising AND circuits interposed between said at least one of said column address buffers and said column decoders.

15. A device as set forth in claim 11, wherein each of said row address decoders comprises an OR logic type circuit, said row degenerating means comprising NOR circuits interposed between said at least one of said row address buffers and said row decoders, and wherein each of said column address decoders comprises an OR logic type circuit, said column degenerating means comprising NOR circuits interposed between said at least one of said column address buffers and said column decoders.

* * * * *